(12) United States Patent
Sposili et al.

(10) Patent No.: US 6,577,380 B1
(45) Date of Patent: Jun. 10, 2003

(54) HIGH-THROUGHPUT MATERIALS PROCESSING SYSTEM

(75) Inventors: Robert S. Sposili, New York, NY (US); Nestor O. Farmiga, Clifton, NJ (US); Kanti Jain, Hawthorne, NY (US)

(73) Assignee: Anvik Corporation, Hawthorne, NY (US)

( * ) Notice: Subject to any disclaimer, the term of this patent is extended or adjusted under 35 U.S.C. 154(b) by 483 days.

(21) Appl. No.: 09/621,043

(22) Filed: Jul. 21, 2000

(51) Int. Cl.$^7$ ................................................ G03B 27/54
(52) U.S. Cl. ........................................... 355/67; 355/53
(58) Field of Search ............................... 355/53, 66, 67

(56) References Cited

U.S. PATENT DOCUMENTS

| | | | | |
|---|---|---|---|---|
| 5,194,893 A | * | 3/1993 | Nishi | 355/53 |
| 5,473,408 A | * | 12/1995 | Hoffman et al. | 355/53 |
| 5,601,733 A | * | 2/1997 | Partlo | 219/121.7 |
| 6,366,308 B1 | * | 4/2002 | Hawryluk et al. | 347/256 |

* cited by examiner

Primary Examiner—Russell Adams
Assistant Examiner—D. Ben Esplin
(74) Attorney, Agent, or Firm—Carl C. Kling

(57) ABSTRACT

A materials-processing system based on projection irradiation using a pulsed-laser source is disclosed. The salient features include a novel illumination system containing a homogenizer that produces a self-luminous light beam of selected cross-section, spatially uniform intensity, and selected numerical aperture, as well as a novel high-efficiency, energy-recycling exposure system that provides pulse-duration extension. The output of the pulsed-laser source is shaped, optionally attenuated, and homogenized, and the pulse duration is extended by the illumination system, including beam-shaping optics, homogenizer, and optionally a condenser lens or pulse-extender-plate (PEP). The illumination is imaged either onto the mask, which is in turn imaged onto the substrate, or the illumination is imaged onto the substrate directly. The high-fluence irradiation effects a desired physical change in the material, for example melting and solidification as required in the sequential lateral solidification (SLS) process. Concurrently, the substrate and/or mask are translated, in a manner precisely coordinated with the laser pulses, as dictated by the particular process being conducted. The high efficiency of the illumination system, combined with the ability to shape the homogeneous illumination into a variety of shapes, such as a high-aspect-ratio rectangle, for example, and the pulse-duration extension, renders the system uniquely capable of executing various materials-processing operations, such as SLS, post-doping annealing, and ablation in a high-throughput manner.

22 Claims, 4 Drawing Sheets

HIGH-THROUGHPUT MATERIALS PROCESSING SYSTEM

CROSS-REFERENCE TO RELATED APPLICATIONS (NONE)

STATEMENT REGARDING FEDERALLY SPONSORED RESEARCH OR DEVELOPMENT (NONE)

REFERENCE TO A MICROFICHE APPENDIX (NONE)

BACKGROUND OF THE INVENTION (1) Field of the Invention

This invention relates to a materials-processing system for applying controlled pulses of radiation to materials for making physical changes, and more particularly relates to a highly uniform, high-efficiency optical illumination system which is highly controllable in shape, intensity, and pulse duration to achieve high resolution imaging for materials processing.

(2) Description of Related Art

Several techniques have been developed for converting thin amorphous silicon films into polycrystalline films. See Im and Sposili, *Materials Research Society Bulletin*, 21, 39(3) (1996). This is desirable because better-performing thin-film transistor (TFT) devices can be fabricated from crystalline silicon than from amorphous silicon, and it is not possible to deposit silicon films directly in a high-quality crystalline state. Among the various crystallization techniques, those based on excimer laser irradiation (or pulsed-laser irradiation more generally) are prevalent because they are compatible with substrates that cannot withstand high-temperature processing; the techniques can be applied when the silicon film to be crystallized is deposited on such a substrate. Glass and other substrates that cannot withstand high-temperature processing (e.g., plastics) are required for use in many TFT applications, for example, in displays.

Sequential lateral solidification (SLS) is a particular type of excimer laser crystallization process that can produce previously unavailable large-grained and grain-boundary-location-controlled microstructures in thin silicon films. The technique is well documented; see Sposili and Im, *Applied Physics Letters*, 69, 2864 (1996); Sposili and Im, *Applied Physics A*, A67, 273 (1998); Im, Sposili et al., *Applied Physics Letters*, 70, 3434 (1997); Sposili, Crowder et al., *Mater. Res. Soc. Symp. Proc.*, 452, 953 (1997); and Im, Crowder et al., *Physica Status Solidi A*, 166, 603 (1998). Films having these microstructures are superior to the types of random-microstructure polycrystalline silicon produced by other excimer laser crystallization processes (and by non-excimer-laser-based crystallization processes as well) in that the TFTs exhibit a combination of superior electronic performance (e.g., higher carrier mobility) and a high level of device-to-device uniformity. The availability of high-performance TFT devices enables numerous applications, such as integrated active-matrix liquid-crystal displays (IAMLCDs), where the driver circuits and other electronics are integrated directly onto the substrate along with the pixel-controlling transistors, and active-matrix organic light-emitting displays (AMOLEDs), among others.

SLS requires that with each irradiation the silicon film be completely melted in and only in a micron-sized spatially controlled region or regions, and that the film be translated with sub-micron precision in between irradiations such that the lateral crystallization induced by each irradiation overlaps with that produced previously. Various schemes have been proposed for conducting the SLS process, and different approaches exist for effecting the requisite spatial tailoring of the beam. Projection irradiation is a very flexible method, wherein a patterned mask is imaged onto the film in order to define the location and extent of the molten zones. Generally, any projection SLS system would contain the following elements: a pulsed-laser source, typically an excimer laser; an illumination system, including a homogenizer, to provide uniform illumination of the mask; an imaging system to image the mask pattern onto the film, typically at 5:1 or greater reduction, although 1:1 imaging is a possibility; and a high-precision sub-micron sample-translation system.

Such SLS projection systems are similar in many respects to photolithography and ablation systems based on excimer lasers; the basic components listed above are common to all. While the various components and subsystems have the same general purpose for each type of projection system, the requirements of the processes differ and therefore so does the configuration of the subsystems. For example, a system intended for photolithography might require imaging resolution on the order of 1 $\mu$m, whereas a resolution of 3–5 $\mu$m is usually adequate for SLS. Conversely, SLS has more-stringent requirements than photolithography and ablation in other respects.

An excimer laser projection system designed for SLS requires a high fluence-sufficient to completely melt a silicon film in the exposed region or regions. Spatially homogenous illumination is also essential so that all of the irradiated areas are irradiated at a fluence greater than the complete-melting threshold of the film. If the intensity is too low in particular regions, the film will not melt completely, leading to failure of the process; if the intensity is too high, film damage can occur.

For certain high-throughput configurations of SLS, it would be beneficial to be able to configure the illumination into a high-aspect-ratio form (e.g., a long, narrow rectangle) while maintaining a high degree of spatial uniformity. Techniques describing an internally reflective homogenizer, using a polygonal cross-section, fully internally mirrored chamber to convert collimated light into self-luminous light at an output aperture have been reported in Jain, U.S. Pat. No. 5,059,013 and Farmiga, U.S. Pat. No. 5,828,505. These homogenizer designs offer the additional benefit of preserving numerical aperture (NA) of the illumination, which allows for high optical efficiency. Further, the ability to vary the configuration of the illumination between the high-aspect-ratio shape and some other polygonal shape would also be extremely useful, as it would enable the equipment to be reconfigured between the high-throughput and other variants of the SLS process. For example, a homogenizer with a rectangular cross-section could be constructed wherein one of the sides would be adjustable, enabling one dimension of the rectangle (and thus the aspect ratio) to be varied. An system with such a homogenizer could conveniently be reconfigured to perform different variants of the process as desired. Existing illumination and homogenization schemes that have been applied to SLS cannot provide the requisite level of spatial uniformity in a high-aspect-ratio shape, and are generally limited to providing square or near-square illumination.

The beam area over which a sufficiently high fluence can be maintained is defined primarily by the energy output of the excimer laser source, but for a given laser, fluence can be optimized by a highly efficient optical system, especially one incorporating an energy-recycling scheme. Large-field homogeneous illumination is a prerequisite for a large-working-area beam, which is necessary in order that the process have a high throughput.

A high-efficiency energy-recycling exposure system has been reported. See Hoffman and Jain, U.S. Pat. No. 5,473,408. This scheme offers the additional feature, by the very nature of the energy-recycling scheme with its multiple reflections of portions of the pulse through the optical system, of extending the effective duration of the excimer laser pulse reaching the substrate. Pulse extension beyond the approximately 30-ns FWHM (full-width half-maximum) typically provided by most commercially available excimer lasers offers two benefits to the SLS process: (1) the longer pulse provides some amount of substrate heating, which delays the onset of nucleation during solidification, allowing for a longer lateral growth distance, and therefore increases the throughput of the process; and (2) the substrate heating reduces the thermal gradients during solidification, which in turn reduces the number of intragrain defects, further improving the quality of the crystallized films.

The energy-recycling scheme requires that the illumination and imaging systems be near-telecentric. Telecentricity provides the additional benefits of more-uniform illumination and more-uniform imaging over the entire respective fields compared with non-telecentric optical systems.

Furthermore, given the ability to produce high-aspect-ratio illumination, or more generally, arbitrarily shaped illumination, one could consider imaging the illumination directly without having to use a mask. Such direct imaging of the illumination would significantly increase the efficiency of the imaging system because all of the illumination would be used to irradiate the film; none of the beam energy would be blocked by the mask.

Accordingly, there exists a need in the field for a projection-irradiation-based SLS excimer laser crystallization system incorporating all of the elements and features listed above, with special emphasis on the use of the novel configurable illumination system.

BRIEF SUMMARY OF THE INVENTION

The invention is a system for materials processing with projection irradiation using a pulsed laser source. The material, commonly referred to as the substrate, is made available at a work station for processing by a patterned laser beam. The system typically includes mechanisms for positioning and translating large-area substrates. The positioning may be static, but generally includes a schedule of scanning and stepping that is coordinated with the irradiation in a manner consistent with the requirements of the particular process being conducted. During the scanning motion, the system at the same time provides controlled laser pulses, modifying the laser radiation in an illumination subsystem, and projecting the patterned, modified laser radiation along an optical path to a carefully controlled area on the surface of the substrate.

The output of the laser pulse is controlled in energy and repetition rate, and supplied to the illumination system, which attenuates the beam energy as necessary, reshapes and homogenizes the beam, and provides uniform self-luminous illumination in the desired shape. The homogenizer is an optical tunnel with fully mirrored walls and a polygonal cross-section. Many configurations are available, depending on the desired shape of the illumination. The homogenizer can be constructed so as to be reconfigurable; for example, a rectangular cross-section with one moveable side so that the aspect ratio of the illumination can be adjusted. The internally mirrored surfaces of the homogenizer provide multiple reflections; the mixing of the rays and the resulting randomization of the beam within the homogenizer converts the incident beam into spatially homogenized, self-luminous illumination at the output aperture. The energy-recycling subsystem recovers energy reflected off of the mask that otherwise would have been lost and reintroduces it into the illumination. The re-reflected portion of the beam passes along the optical path two additional times, and depending upon the length of the optical path, is delayed approximately 3.3 ns per meter of beam travel. When all of the secondary, tertiary, and higher-order re-reflected pulses are superimposed on the original pulse, the resulting 5–10-ns delay per re-reflection extends the laser pulse duration by 15–30%. Otherwise-wasted laser power is conserved, and there is an opportunity to control pulse duration quite effectively. The entire optical path up to the mask, with the illumination subsystem including the energy-efficient recycling homogenizer, forms an optical pulse stretcher.

In the case where the output of the homogenizer is imaged directly without employing a patterned mask to define the beam features, a pulse-extender plate (PEP), consisting of an essentially transparent but partially reflective material such as fused silica, can be used to reflect some of the beam energy back into the energy recycler in order to extend the pulse duration. In either case (using a mask or a PEP), the exact amount of temporal extension can be controlled by adjusting the optical length of the pulse stretcher and by engineering the reflectivity of the mask or PEP, for example through the use of partially reflective dielectric coatings.

The imaging system projects the image of the mask, or in the case of the maskless system, of the illumination itself onto the substrate. A significant portion of the patterned beam energy is absorbed by the substrate and effects a physical change, usually through a thermal mechanism as a result of localized intense heating. However, other modes of interaction between the beam and the substrate are possible, depending on the specific substrate material and the wavelength of the laser radiation.

The localized intense heat is useful in many materials-processing operations, including those involving localized melting and resolidification, such as excimer laser annealing (ELA) in general and SLS in particular, and dopant activation, as well as those involving localized ablation and removal of material.

The object of the invention is to provide a high-fluence, shaped, spatially homogenized, duration-controlled, and carefully imaged radiation beam at the chosen area or areas of the substrate, which can be translated in an extremely precise and controllable manner in coordination with the irradiation, in order to accomplish the desired physical change.

A feature of the invention is the use of a novel optical system, including an illumination subsystem to produce a self-luminous beam of selected cross-section, spatially uniform intensity, and selected numerical aperture, as well as a high-efficiency energy-recycling exposure system, which controls the duration of radiation pulses and conserves energy.

An advantage of the invention is that the desired physical changes to the substrate can be controlled and the processing can be optimized (e.g., for high throughput) by full control of the applied irradiation; by controlling fluence, beam shape, homogenization, pulse duration, image pattern, and translation schedule of the substrate with respect to the beam.

BRIEF SUMMARY OF THE INVENTION USED IN SLS

The invention is a system for conducting the sequential lateral solidification (SLS) process on substrates, including large-area substrates, containing a thin surface layer of material to be crystallized, typically but not limited to amorphous silicon (a-Si).

The purpose is to create desirable microstructures in the film, such as large-grained, grain-boundary-location-controlled polycrystals and large single-crystal islands at selected locations on the substrate.

It is the object of the invention to provide a novel optical system including: (1) an illumination system to produce a self-luminous beam of selected cross-section, spatially uniform intensity, and selected numerical aperture; (2) a high-efficiency energy-recycling exposure system to control the pulse duration and to make efficient use of the beam energy; (3) telecentricity of both illumination and imaging systems for improved uniformity of illumination and imaging over large fields; and (4) high-resolution imaging of features onto the film.

Another object of the invention is to provide a practical system for conducting SLS on large substrates using the novel optical system in conjunction with a high-precision, large-travel translation system.

Another object of the invention is to provide a practical system for pulsed-laser electronic activation of dopants either concurrently with SLS processing for pre-doped films, or as a separate processing step for films doped after being crystallized.

A feature of the invention is the use of a novel illumination system to produce a self-luminous light beam of selected cross-section, spatially uniform intensity, and selected numerical aperture.

Another feature of the invention is the use of a high-efficiency energy-recycling exposure system, which controls the duration of radiation pulses and conserves energy.

An advantage of the invention is the ability to configure the homogenous illumination into various shapes, including a high-aspect-ratio polygon, which is well-suited for certain high-throughput variants of the SLS process.

Another advantage of the invention is the ability to reconfigure the shape of the illumination so that different variants of the SLS process can be conducted on different areas of the substrate, so as to optimize the microstructure and throughput as appropriate for the desired application.

Another advantage of the invention is the ability to adjust the pulse duration so as to (1) increase the lateral growth distance and in turn the throughput of the process, as well as (2) reduce the number of intragrain defects forming during solidification and in so doing improve the quality of the crystallized films.

Another advantage of the invention is that the same tool may be used for both SLS and post-doping annealing (dopant activation).

Other objects, features and advantages of the invention will be apparent from the following written description, claims, abstract, and the annexed drawings.

DETAILED DESCRIPTION OF THE INVENTION

Figure 1:
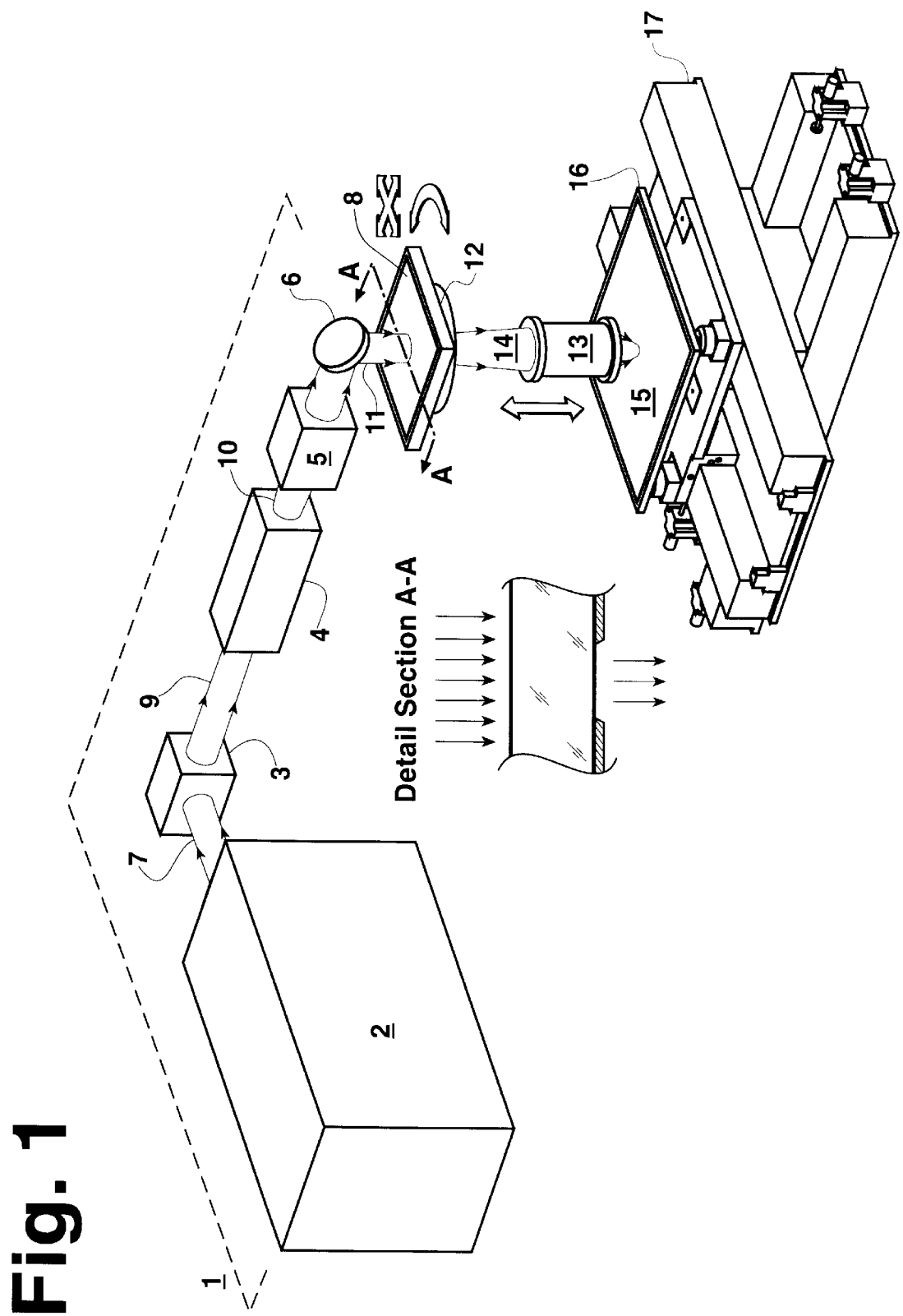
FIG. 1 is a semi-schematic isometric view of a preferred embodiment of the system.

FIG. 1 shows a preferred embodiment of the invention, a high-resolution, general-purpose pulsed-laser irradiation tool for effecting localized physical changes to a substrate. Illumination subsystem 1 comprises laser 2, beam-shaping module 3, homogenizer 4, condenser lens 5, and folding mirror 6.

Laser 2 is preferably a XeCl excimer laser operating at a wavelength of 308 nm with a nominal pulse duration of 30 ns FWHM and a pulse repetition rate that can be varied between one and several hundred pulses per second (Hz). Laser 2 may be located outside the typical cleanroom where the actual substrate treatment is to be done. The output beam 7 from laser 2 typically is directed horizontally to traverse the distance from the laser location to the tool location, and may be contained within a protective enclosure for operator safety. The output beam 7 from laser 2 is processed and directed by the other components of illumination system 1 before illuminating the mask 8.

The output beam 7 of the laser 2 passes into the beam-shaping module 3, which uses cylindrical and spherical optics to modify the shape of the raw beam into a form well-matched to the input aperture of the homogenizer 4. The beam-shaping module includes a focusing lens for providing a highly divergent beam for input into the homogenizer. The beam-shaping module 3 may also include an energy attenuator for fine control of the beam energy, for example based on a dielectric-coated transparent plate whose transmission is incident-angle-dependent. The energy attenuator allows for finer control of the beam energy than is possible by adjustment of the laser operating voltage alone. The output beam 9 of the beam-shaping module is directed into the homogenizer 4, wherein multiple reflections and mixing of rays effect superposition of different segments of the input beam, leading to spatial uniformity of the intensity. The degree of uniformity is determined by the number of reflections that the beam segments make within the length of the homogenizer. The number of reflections can be calculated as follows. For the case where the homogenizer has a regular hexagonal cross-section, the number of reflections is given by $$N = \frac{L \cdot NA}{2\sqrt{3}\, l_h n} \quad (1)$$

where N is the number of reflections, L is the length of the homogenizer, NA is the numerical aperture of the focusing lens (part of the beam-shaping module), $l_h$ is the length of a side of the hexagonal cross-section, and n is the index of refraction inside the homogenizer. A more detailed description of the principles behind the operation of the homogenizer can be found in U.S. Pat. No. 5,059,013.

The cross-section of the homogenizer can be built in many different shapes, usually polygonal, as described in U.S. Pat. No. 5,828,505. The cross-section of the homogenizer defines the shape of the resulting illumination. Certain shapes may offer advantages in particular applications or variants of the process to be conducted. Additionally, for certain shapes, the homogenizer can be constructed so as to be reconfigurable; for example, one side of a rectangular homogenizer cavity may be adjustable, allowing the aspect ratio of the rectangular illumination to be adjusted.

The spatially homogenized, self-luminous beam 10 output from the homogenizer is imaged onto the mask 8 by the condenser lens 5 and folding mirror 6 as illumination beam 11. Mask 8 is held in mask stage 12, which is capable of translating the mask in one or more axes, and optionally is capable of rotating the mask. The mask-translation capability is useful for repositioning the mask in-between processing runs in order to utilize different mask patterns, and also may be useful for translating the mask during processing. The mask pattern is imaged onto the substrate by the imaging system including projection lens 13. This will be discussed in more detail later.

A significant portion of the mask, perhaps 95% depending on the details of the mask pattern, is reflective, so a significant portion of processed beam 11 is reflected and returned to energy-efficient re-reflecting homogenizer 4. Thus, the homogenizer 4 not only converts the incident laser beam to self-luminous radiation by multiple internal reflections, but also collects reflected radiation from the mask 8. After being re-reflected back into the homogenizer 4, these radiation sub-beams mix and combine within the chamber of the homogenizer, wherein they contribute to the spatially uniform self-luminous output.

Figure 2:
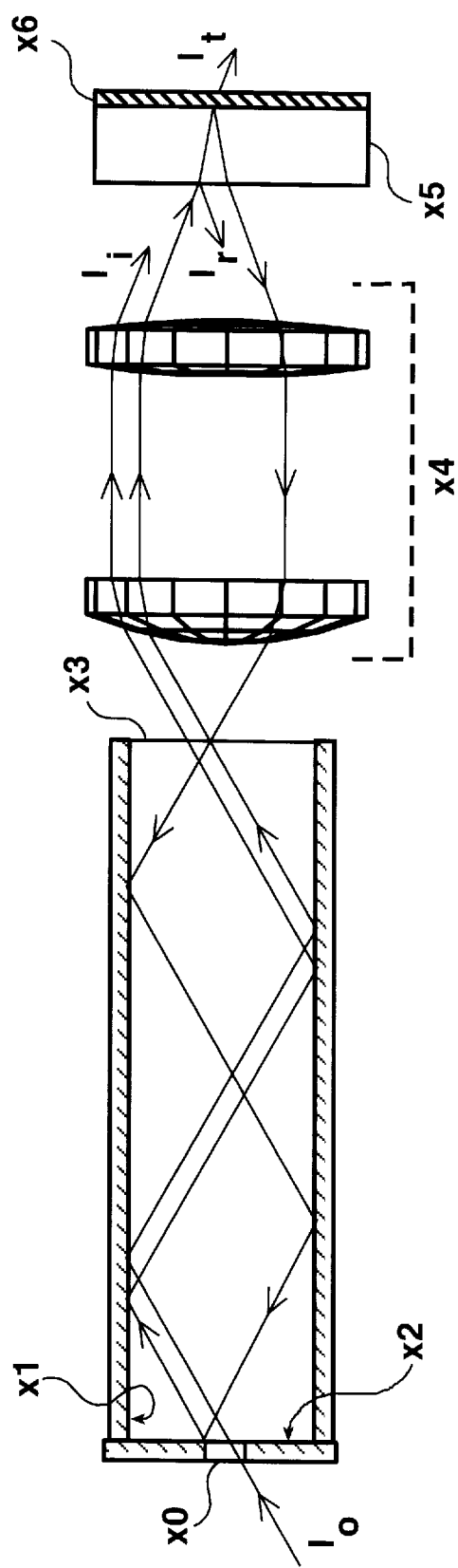
FIG. 2 is a diagrammatic view of the high-efficiency energy-recycling portion of the illumination subsystem.

FIG. 2 illustrates the principles behind the operation of the energy recycler. Initial ray $I_o$ passes through focus at the input aperture x0, and enters the chamber of the homogenizer. After undergoing several reflections off reflective surfaces x1 within the homogenizer, the different rays recombine with other similarly reflected rays at the output aperture x3 to become self-luminous illumination. The condenser lens x4 images the output aperture x3 of the homogenizer onto the patterned surface of the mask x6. The incident rays $I_i$ are partially transmitted through the mask as ray It, as defined by the pattern of x6, and partially reflected, both at the rear surface of the transparent body of the mask x5, and at the interface with the reflective patterned layer x6. These reflected rays $I_r$ return through condenser lens x4 back into the chamber of the homogenizer, wherein further reflections off walls x1 occur. If the energy recycler is designed to be nearly telecentric, most of the reflected rays will be guided back into the homogenizer in this way. However, if the recycler is not exactly telecentric, then the return paths of the rays will differ slightly from the original paths, such that the reflected rays will miss the small input aperture x0 of the homogenizer. Instead, they will undergo a reflection off surface x2, which returns them to the forward illumination. Energy that otherwise would have been lost is recollected and recycled back into the beam. Additionally, the extra trips through the homogenizer augment the spatial uniformization of the beam beyond that provided by a single traversal. For a more-detailed description of the operation of the high-efficiency energy recycler, see U.S. Pat. No. 5,473,408.

Figure 4:
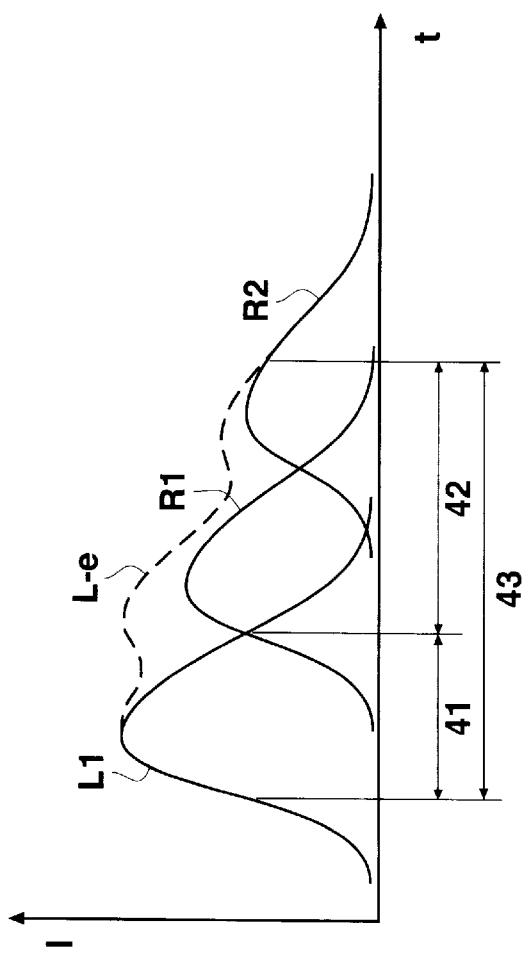
FIG. 4 is a discussion diagram of a composite waveform showing how the energy-recycling portion of the illumination subsystem extends the effective temporal profile of the laser pulses.

The rays make two additional trips through the energy-recycling portion of the system per re-reflection. Thus, the re-reflection delay may be on the order of 5–10 nanoseconds per re-reflection cycle or more, depending on the optical path length between the entrance to the homogenizer and the mask. Inevitably, there will be losses associated with each pass through the optical system, so each re-reflected beam will be reduced in intensity relative to the primary beam. FIG. 4, which is a plot of intensity I versus time t, illustrates the cumulative effect of the recombination of the various re-reflected beams with the primary beam. Curves L1, R1, and R2 represent the temporal intensity profiles of the primary beam and the first and second re-reflected beams, respectively, at a fixed point in the system, for example at the output aperture of the homogenizer. The pulse duration for the primary beam L1 only, defined as the FWHM (full width at half maximum), is shown as temporal length 41. With the intensity of the re-reflected beams R1 and R2 added to L1, the cumulative temporal intensity profile L-e is obtained. Based on the original half-maximum intensity, the duration of the pulse envelope is increased by temporal length 42 to give a total pulse duration 43. Because each re-reflection through the system decreases the intensity of the beam, only the first few re-reflections, for example those whose peak intensity exceeds a certain threshold intensity value necessary to effect the desired physical modification in the material being treated, make a significant contribution to the pulse extension.

A Note on Refelections

The Re-Reflection Delay Cycle is a phenomenon that at first may seem totally mystifying, understandable only in the discussion of speed-of-light, small-distance optical path and sub-nanosecond frequencies, but re-reflection is not unheard of in science. Early computations of speed-of-light sometimes used spinning mirrors reflecting and re-reflecting off fixed return mirrors so that the marginally reliable clocks available could count the ticks with relation to the re-reflections over reasonably large distances. Early shipboard radar used the double-echo check to calibrate distance without concern for antenna and equipment delays. The radar pulse would reflect off a sister ship sailing parallel, return and be re-reflected. The distance between re-reflection blips on a scope was a function of the distance between ships, irrespective of the antenna delay.

Except for such schemes as the double-echo check, re-reflections generally were considered to be undesirable glitches in the system, eliminated from calculations as noise as were most harmonics.

Re-reflections in the past generally were dismissed from industrial optical imaging tool usage as undesirable, if considered at all, with the notable exception of the energy-efficient homogenizer of U.S. Pat. No. 5,473,408. Even there, the emphasis was on power retention, not pulse-duration extension, though some pulse-duration extension may be an inherent quality of the device. This was particularly the case when it is noted that the typical system usage contemplated was in a scanning system featuring intensity smoothing, not pulse-duration extension. Why not, one might ask, simply extend the duration of the laser pulse as output by the laser? Although this is possible, in principle, through proper design of the laser, such an intrinsic characteristic of the laser output is not easily tailored without significant consequences to other aspects of the laser's performance (i.e., significant engineering trade-offs) and without significant impact on the cost of the system. Thus, the vast majority of currently available pulsed lasers that are most suited for application in this type of materials-processing system are limited to pulse durations in the neighborhood of 30 ns FWHM.

Figure 5:
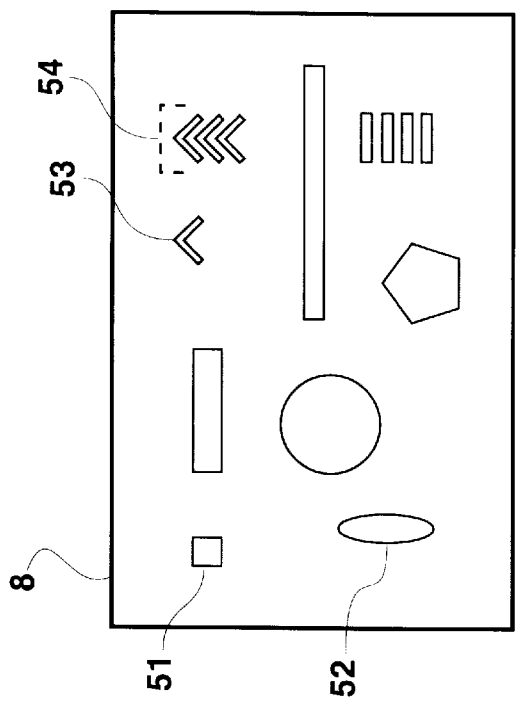
FIG. 5 is a composite diagram showing a variety of mask configurations, or cross-sectional configurations for the output aperture of the homogenizer portion of the illumination subsystem.

Returning to consideration of FIG. 1, mask 8 is mounted on mask stage 12. The patterns and features on mask 8 will vary as appropriate to the particular details of the process being conducted. For example, FIG. 5 shows some representative patterns that might be useful for conducting various materials-processing operations. Mask 8 may be fabricated out of radiation-transmissive material commonly referred to as "quartz" (actually man-made fused silica), with features defined by a layer of patterned chrome, or for applications where the fluence at the mask exceeds the damage threshold of chrome, a layer of patterned aluminum can be substituted, or for even greater damage resistance, a mask constructed of layers of patterned dielectric materials designed to be reflective at the appropriate wavelength can be used.

The portion of the processed beam 11 that encounters no chrome (or aluminum or dielectric stack) is mostly unreflected, and passes through the mask 8 patterned beam 14 to the entry of projection lens 13, which is commonly a reduction lens, for example 5:1, optimized for the laser output wavelength. The projection lens may be mechanically mounted such that adjustment of its vertical position can be effected for focusing. The projection lens housing may also incorporate an adjustable iris in order to vary the numerical aperture of the lens. This might be useful, for example, for optimizing the trade-off between resolution and depth of focus (DoF); reducing the numerical aperture will sacrifice resolution while increasing the DoF. Detail Section A—A in FIG. 1 shows how the patterned mask selectively transmits the incident radiation. The mask pattern is imaged onto the surface of substrate 15, which is carried for presentation in substrate chuck 16 on the substrate stage 17. Substrate chuck 16 contains mechanisms for vertical adjustment and leveling of the substrate so as to coincide with the image plane of the objective lens.

The portion of the processed beam 11 that passes through the transparent regions of the mask 8 is imaged onto the surface of substrate 15. A large portion of the energy of the imaged pattern is absorbed by the substrate in the irradiated zone or zones, effecting the desired physical change in the material. For example, the localized intense heat may effect melting and subsequent resolidification in the irradiated zone or zones as required by the SLS process. Such melting and resolidification is also useful for post-doping annealing of semiconductor thin films. Another useful process that can be treated is patterned laser ablation of various materials.

In addition to the delivery of the beam energy at sufficient fluence in the patterns and at the locations defined by the mask, an important element of the system is the ability to translate the substrate (and/or the mask) in a specific schedule of scanning and stepping precisely coordinated with the laser pulses. The details of the translation schedule are specific to the particular process being conducted and will not be elaborated upon here. For example, the methods for producing large-grained and grain-boundary-location-controlled crystalline thin films using the SLS process have been documented elsewhere. It suffices to say that both the mask stage 12 and substrate stage 17 will incorporate sufficient translational and rotational degrees of freedom (X—Y—Z—θ), as well as sufficient accuracy and repeatability in the respective axes, as required by the particular process under consideration.

The substrate treatment tool is shown in FIG. 1 in a predominantly vertical configuration, a convenient configuration for operator convenience and for conserving valuable cleanroom floor space.

Figure 3:
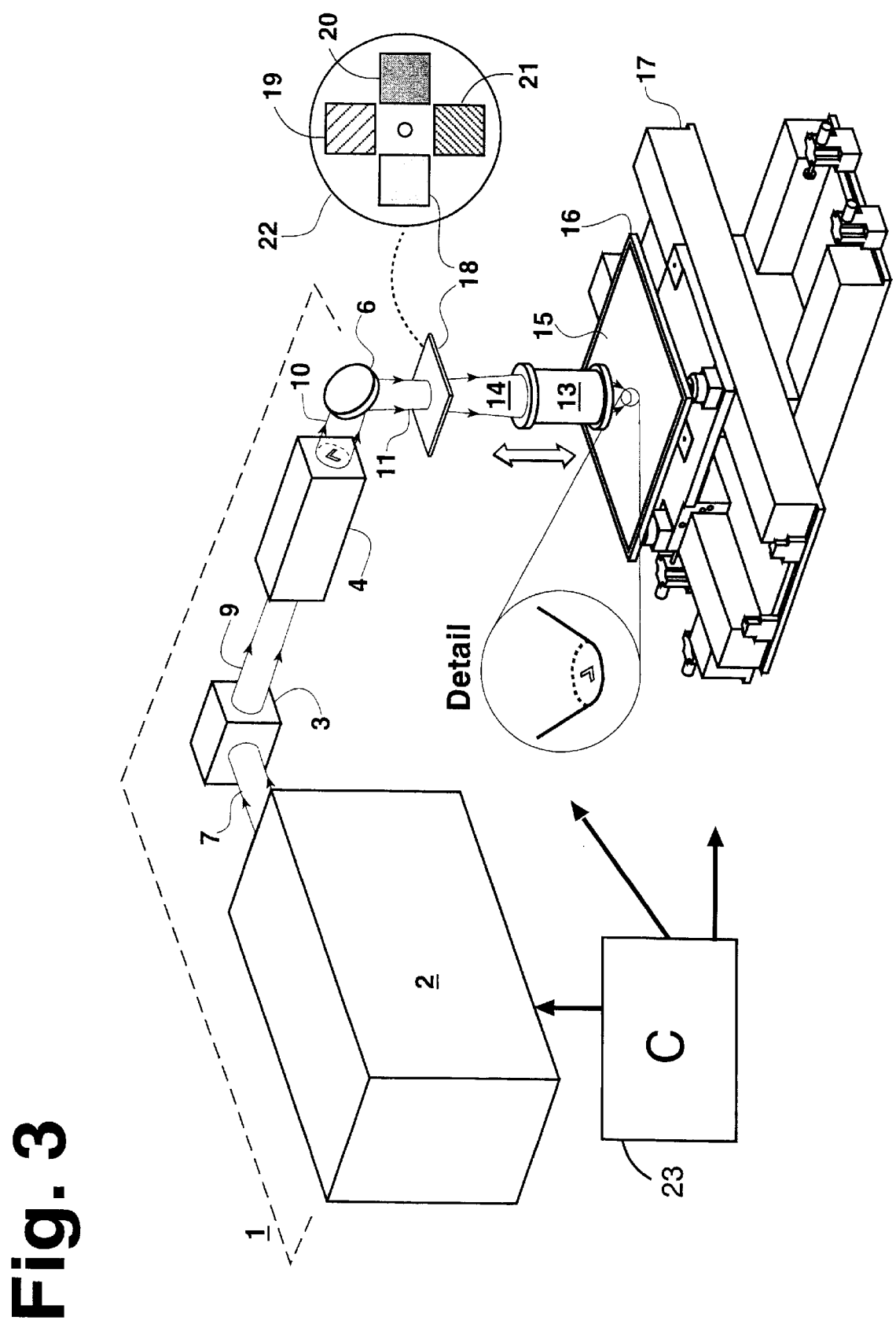
FIG. 3 is a semi-schematic isometric view of a second preferred embodiment of the system.

FIG. 3 shows another preferred embodiment of the invention, a maskless high-resolution, general-purpose pulsed-laser irradiation tool for effecting localized physical changes to a substrate. The system depicted in FIG. 3 is identical to that shown in FIG. 1, contains the same subcomponents, and operates under the same principles, as described above, with the following exceptions:

The output of the homogenizer 4 is imaged directly onto the substrate 15 by objective lens 13. There is no mask or condenser lens as in the system of FIG. 1. The output aperture of the energy-efficient homogenizer 4 itself defines the pattern to be imaged onto the substrate 15. For example, the Detail in FIG. 3 shows a chevron-shaped pattern being imaged. Various homogenizer cavity cross-sections can be considered, and the particular shape chosen will be determined by the requirements of the particular process to be conducted. FIG. 5 shows various patterns that might be of interest for materials-processing operations, including, but not limited to a square 51, ellipse 52, chevron 53, and a series of chevrons or "sergeant's stripes" 54. As in the case of the system of FIG. 1, the homogenizer cross-section can be designed to be reconfigurable in certain shapes by having one or more adjustable sides. The details of construction of such a reflective homogenizer can be found in U.S. Pat. No. 5,828,505.

The advantage of such a scheme over that shown in FIG. 1 is that beam energy is used more efficiently. Rather than having only a small portion of the illumination pass through the features defined by the mask as in the system of FIG. 1, all of the radiation is channeled into the useful portion of the beam as defined by the construction of the homogenizer.

Nonetheless, in the configuration of FIG. 1 there is some advantage in recycling some portion of the beam energy back through the system for the purpose of pulse-duration extension as described previously. For this purpose, in the embodiment of FIG. 3, a pulse-extender plate (PEP) 18 is used to reflect a fraction of the beam back into the homogenizer. The PEP can be fabricated out of a predominantly transparent material such as fused silica, which will transmit most of the beam but will reflect a small portion of it. The reflectivity of the PEP can be modified from that of the base material by the addition of a dielectric coating or coatings. This provides another means, in addition to adjusting the optical path length of the energy recycler, for optimizing the temporal profile of the beam envelope and the pulse-duration extension as appropriate for the particular process. In another embodiment of the invention, the desired pulse extender plate is selected from a multiplicity of different plates, of different reflectivities, to provide different effective pulse durations. As shown in FIG. 3, the different pulse extender plates (18–21) may conveniently be mounted, for example on a carousel (22), which is suitably indented to accurately locate any desired plate in position of operation.

Control means 23 serves the radiation source, the beam conditioning subsystem and the substrate presentation means.

What is claimed is:

1. A processing system for treating materials by high-fluence radiation for sequential lateral solidification, comprising:
   a) a radiation source (2) producing a beam;
   b) a beam conditioning subsystem (3–8) capable of accepting said beam and delivering a conditioned beam (8) of radiation pulses having the following:
      defined size and shape,
      uniform spatial intensity profile,
      self luminosity,
      defined numerical aperture,
      defined temporal characteristics; and
      near-telecentricity;

c) means (10) for positioning a mask (9) having a pattern, with relation to said beam conditioning subsystem such that said conditioned beam (8) of radiation pulses is incident upon the mask (9), transmitting the pattern and reflecting the non-pattern back into the beam conditioning subsystem for re-reflection incident upon the mask (9);

d) means (15,16) for presenting a substrate (14);

e) projection imaging means (13), of defined numerical aperture, for producing a high-fluence image of the pattern on said mask (9) onto said substrate (14); and f) control means for operating said radiation source (2), said beam conditioning subsystem and said substrate presentation means in sequential lateral solidification mode.

2. A processing system for treating materials, according to claim 1, wherein said radiation source (2) is an ultraviolet laser.

3. A processing system for treating materials, according to claim 2, in which said ultraviolet laser is a pulsed excimer laser of controllable pulse repetition frequency and defined pulse temporal characteristics.

4. A processing system for treating materials, according to claim 1, in which said beam conditioning subsystem produces a beam of defined polygonal shape.

5. A processing system for treating materials, according to claim 4, in which the polygonal shape of said beam is a rectangle of defined aspect ratio.

6. A processing system for treating materials, according to claim 4, comprising means to vary the aspect ratio of said polygonal shape.

7. A processing system for treating materials, according to claim 1, in which said projection imaging means includes a variable aperture to enable variation of the numerical aperture of imaging.

8. A processing system for treating materials, according to claim 7, in which said beam conditioning subsystem includes means to vary the numerical aperture of the beam delivered to the mask.

9. A processing system for treating materials, according to claim 1, in which said beam conditioning subsystem includes a reflective homogenizer comprising a light tunnel with internally reflecting walls.

10. A processing system for treating materials, according to claim 9, in which said homogenizer (6) is an energy-reflecting homogenizer capable of re-utilizing radiation reflected from post-homogenizer plane surfaces and of reconfiguring the temporal characteristics of the radiation pulse.

11. A processing system for treating materials, according to claim 10, in which said recycling homogenizer comprises
a light tunnel made of multiple mirror strips which are internally reflecting; and
an entry face plate with an aperture for entry of radiation, and which is reflecting on the inner face for re-reflection of radiation received from at least one post-homogenizer surface, and thereby reconfigures the intensity profile and temporal characteristics of the radiation pattern, including extension of its duration, incident on the substrate; and
in which the near-telecentricity departs slightly from exactness by an amount sufficient to move reflections away from said aperture for entry of radiation so as to avoid loss of reflected energy back out said aperture for entry.

12. A processing system for treating materials, according to claim 11, in which at least one of the mirrored surfaces of the homogenizer is movable so as to enable reconfiguration of the homogenizer output beam profile.

13. A method of treating materials for sequential lateral solidification, comprising the following steps:

1) activating a radiation source to produce a beam of high-fluence pulses;

2) providing such beam of pulses to a beam conditioning subsystem capable of accepting said beam and delivering a conditioned beam of radiation pulses having the following properties:
defined size and shape,
uniform spatial intensity profile,
self luminosity,
defined numerical aperture, and
defined temporal characteristics;

3) positioning a mask so that said conditioned beam of radiation pulses is incident upon the mask, transmitting the pattern, and reflecting the non-pattern back into the beam conditioning subassembly for re-reflection so as to be re-incident upon the mask;

4) presenting a substrate;

5) projecting a pattern from said mask onto said substrate, with said defined numerical aperture, and with redefined temporal characteristics related to speed-of-light delay of reflection and re-reflection; and 6) controlling the pulses from the radiation source, the beam conditioning and the substrate presentation for delivering high-resolution pulses of controlled pattern, position and duration, incident upon the substrate.

14. A method of treating materials, according to claim 13, in which the step (2) of providing a beam conditioning system and delivering a conditioned beam of radiation pulses further includes
varying the shape of the beam to optimize its aspect ratio for the desired material treatment process.

15. A method of treating materials, according to claim 14, in which step (2) further includes
varying the numerical aperture of the beam to optimize the imaging performance of the projection step (5).

16. A method of treating materials, according to claim 13, in which said projecting step (step 5) includes a plurality of reflections and re-reflections extending the duration of the pattern pulse incident on the substrate, and in which the extension of duration is altered by alteration of the optical distance traveled by reflections and re-reflections.

17. A method of treating materials, comprising the following steps:

1) activating a radiation source to produce a beam of pulses;

2) providing such pulses to a beam conditioning subsystem capable of accepting said beam and delivering a conditioned beam of radiation pulses having:
defined size and shape to serve as a pattern,
uniform spatial intensity profile,
self luminosity,
defined numerical aperture;
defined temporal characteristics; and
near-telecentricity;

3) positioning a partially reflective pulse extending plate so that said conditioned beam of radiation pulses is incident upon said pulse extending plate, transmitting a portion of the beam energy and reflecting the rest of the beam energy back into the beam conditioning subassembly for re-reflection;

4) presenting a substrate;

5) projecting a pattern through said pulse extending plate back onto said substrate, with said defined numerical aperture, and with redefined temporal characteristics related to speed-of-light delay of reflection and re-reflection; and 6) controlling a pulse from the radiation source, controlling the beam conditioning subsystem, and controlling the substrate presentation, for delivering a high-resolution patterned pulse, of controlled pattern, position and duration, incident upon the substrate.

18. A processing system for treating materials, comprising a) a radiation source producing an original beam of pulsed radiation;

b) an energy-recycling beam conditioning subsystem, having an input and an output, capable of accepting said original beam of pulsed radiation at its input as well as accepting additional energy of radiation introduced into its output, and delivering a conditioned beam of radiation having the following:
defined size and shape,
uniform spatial intensity profile,
self luminosity,
defined numerical aperture,
defined temporal characteristics which are a composite function of the pulse duration of the original beam and extension of said duration resulting from time-of-light delays during reflection/re-reflection iterations introduced into said output of said energy-recycling beam conditioning subsystem; and
near-telecentricity;

c) means for positioning a pulse extending plate, having a partial mirror surface for transmitting a portion of radiation incident on it, reflecting at least a portion of the remaining radiation back into said beam conditioning subsystem, where at least a portion of any reflected portion of said conditioned beam of radiation is re-reflected from said beam conditioning subsystem to merge with said original pulse and extend its duration;

d) means for presenting a substrate; and e) projection imaging means, of defined numerical aperture, for producing an image of the output of said beam conditioning subsystem onto said substrate; and f) control means for operating said radiation source, said beam conditioning subsystem and said substrate presentation means.

19. A processing system for treating materials according to claim 18, further characterized in that there is a multiplicity of pulse extending plates, of different reflectivities, to provide different effective pulse durations, mounted on a means so as to enable placing of any desired plate in position of operation.

20. A processing subsystem for treating materials by application of laser pulses in a sequence of such laser pulses including an original pulse having an over-threshold effective duration and including a sequence of at least one overlapping subsequent pulse following the original pulse further characterized by a) an internally mirrored energy-recycling homogenizer having an internally mirrored entry aperture plate, with an input aperture for accepting a sequence of pulses of radiation each having a temporal intensity characteristic, and having an internally-mirrored light tunnel ; and b) a pulse extending plate mounted at a selected optical distance from said internally mirrored entry aperture plate, being partially reflective so as to pass a portion of the energy of an original pulse of radiation while reflecting the rest of the energy of such original pulse back to said internally-mirrored entry aperture plate effectively outside the aperture of said input aperture, for re-reflection at a temporal increment related to speed-of-light travel delay and thus to modify the combined pulse (original plus re-reflected) by giving it a longer temporal duration, and so as to modify selected subsequent pulses similarly.

21. A pulse extending plate, for use with an energy recycling homogenizer, having an internally reflective input aperture plate, having a transparent body and a partially reflective plane surface, to modify the effective trailing edge of an introduced pulse of radiation by a duration related to length of optical travel during a number of reflection/re-reflection iterations such that the duration is a function of the reflectivity of the pulse extending plate and the path length between the homogenizer's internally reflective input aperture plate and said partially reflective plane surface of the pulse extending plate.

22. A composite pulse-extending plate, for use with an energy recycling homogenizer having an internally reflective input aperture plate, said composite pulse-extending plate having a plurality of individual segments each having a partially reflective surface of individually defined reflectivity, arranged for selective introduction of an individual segment into an optical path to extend the trailing edge of an over-threshold effective pulse of radiation by a duration related to speed-of-light pulse travel during a number of reflection/re-reflection iterations which is a joint function of the reflectivity of the individual segment and the path length between the homogenizer's internally reflective input aperture plate and said partially reflective plane surface.

* * * * *